US011848681B2

(12) United States Patent
Duan

(10) Patent No.: US 11,848,681 B2
(45) Date of Patent: Dec. 19, 2023

(54) ADAPTIVE CONTROL OF META-STABILITY ERROR BIAS IN ASYNCHRONOUS SUCCESSIVE APPROXIMATION REGISTER ADC

(71) Applicant: CREDO TECHNOLOGY GROUP LIMITED, Grand Cayman (KY)

(72) Inventor: Yida Duan, Fremont, CA (US)

(73) Assignee: Credo Technology Group Limited, Grand Cayman (KY)

( * ) Notice: Subject to any disclaimer, the term of this patent is extended or adjusted under 35 U.S.C. 154(b) by 78 days.

(21) Appl. No.: 17/644,548

(22) Filed: Dec. 15, 2021

(65) Prior Publication Data

US 2023/0188149 A1 Jun. 15, 2023

(51) Int. Cl.
*H03M 1/10* (2006.01)
*H03M 1/46* (2006.01)
*H03M 1/38* (2006.01)
*H03M 1/40* (2006.01)
*H03M 1/12* (2006.01)

(52) U.S. Cl.
CPC ......... *H03M 1/1023* (2013.01); *H03M 1/125* (2013.01); *H03M 1/38* (2013.01); *H03M 1/40* (2013.01); *H03M 1/462* (2013.01)

(58) Field of Classification Search
CPC .... H03M 1/1023; H03M 1/125; H03M 1/462; H03M 1/38; H03M 1/40; H03M 1/46
USPC .................................................. 341/120, 155
See application file for complete search history.

(56) References Cited

U.S. PATENT DOCUMENTS 8,957,802 B1* 2/2015 Evans ................. H03M 1/0863
341/161
10,749,542 B2* 8/2020 Zabroda ............... H03M 1/462

OTHER PUBLICATIONS

Monostable Multivibrator. Wikimedia Foundation. (Feb. 12, 2021). 2 pages; Retrieved Nov. 11, 2021, from https://en.wikipedia.org/wiki/Transimpedance_amplifier.

(Continued)

*Primary Examiner* — Khai M Nguyen
(74) *Attorney, Agent, or Firm* — Ramey LLP; Daniel J. Krueger

(57) ABSTRACT

Disclosed successive approximation register analog-to-digital converters (SAR ADCs) and conversion methods detect a statistical effect of meta-stability induced errors and limit the level of such errors. One illustrative integrated circuit chip includes: a SAR ADC that employs asynchronous bit cycles to convert a sequence of analog signal samples into a sequence of digital signal samples; and a detector that accelerates the asynchronous bit cycles when a meta-stability error bias exceeds a predetermined threshold. An illustrative analog-to-digital conversion method includes: converting a sequence of analog signal samples to a sequence of digital signal samples using a successive approximation register analog to digital converter (SAR ADC) with asynchronous bit cycles; deriving a meta-stability error bias from the sequence of digital signal samples; and accelerating the asynchronous bit cycles when the meta-stability error bias exceeds a predetermined threshold.

20 Claims, 3 Drawing Sheets

(56) References Cited

OTHER PUBLICATIONS

Kester, Walt, "MT-011: Find Those Elusive Sparkle Codes and Metastable States", Tutorial MT-011, Analog Devices Inc., Norwood, MA, Oct. 2008, 10 pages.

Duan, Yida. "Design Techniques for Ultra-High-Speed Time-Interleaved Analog-to-Digital Converters." University of California, Berkeley, May 1, 2017. https://www2.eecs.berkeley.edu/Pubs/TechRpts/2017/EECS-2017-10.pdf.

* cited by examiner

ADAPTIVE CONTROL OF META-STABILITY ERROR BIAS IN ASYNCHRONOUS SUCCESSIVE APPROXIMATION REGISTER ADC

BACKGROUND

Demand continues for ever-increasing volumes and rates of data communication, demand that is gradually being addressed by sophisticated techniques for transmitting and receiving ever-higher frequency and higher-bandwidth signals via various forms of wireless and physical media. Receivers increasingly rely on digital signal processing for equalization and data recovery, necessitating analog-to-digital conversion at ever-higher sample rates. Successive approximation register analog-to-digital converters (SAR ADCs), particularly those employing asynchronous bit cycles, offer fast, efficient conversion. In current CMOS processes, medium resolution (6 to 8 bit) SAR ADCs can digitize more than $4 \times 10^{10}$ samples per second. A small array of such converters can operate in a time-division multiplexed fashion to digitize receive signals at 400 Gbaud or more.

Asynchronous SAR ADCs suffer from a known weakness: meta-stability. If the signal voltages compared by the ADC's comparator are too closely matched, the comparator is unable to make its decision within the allotted time. In the asynchronous SAR ADC design, an uncompleted bit decision also prevents any subsequent bit decisions in the digitization process, typically causing a large digitization error. The statistics of such meta-stability induced errors are decidedly non-Gaussian; if the meta-stability error energy rises above the noise level of Gaussian noise sources, the receiver's bit-error-ratio (BER) performance will be significantly impaired.

Two existing approaches to the meta-stability issue are described in Y. Duan, "Design Techniques for Ultra-High-Speed Time-Interleaved Analog-to-Digital Converters", EECS-2017-10, University of California at Berkley, May 1, 2017, which is hereby incorporated herein in its entirety for all purposes. Yet there remains room for improvement.

SUMMARY

Accordingly, there are disclosed herein successive approximation register analog-to-digital converters (SAR ADCs) and conversion methods that detect a statistical effect of meta-stability induced errors and potentially operating to limit the level of such errors. As provided in the claims, one illustrative integrated circuit chip includes: a SAR ADC that employs asynchronous bit cycles to convert a sequence of analog signal samples into a sequence of digital signal samples; and a detector that accelerates the asynchronous bit cycles when a meta-stability error bias exceeds a predetermined threshold.

An illustrative analog-to-digital conversion method includes: converting a sequence of analog signal samples to a sequence of digital signal samples using a successive approximation register analog to digital converter (SAR ADC) with asynchronous bit cycles; deriving a meta-stability error bias from the sequence of digital signal samples; and accelerating the asynchronous bit cycles when the meta-stability error bias exceeds a predetermined threshold.

An illustrative parallelized analog to digital converter includes: a switch tree that distributes time-interleaved samples of an analog input signal to an array of successive approximation register analog to digital converters (SAR ADCs), each of the SAR ADCs converting their analog signal samples to digital signal samples using asynchronous bit cycles, the asynchronous bit cycles including an adjustable delay or having an adjustable time limit; and a detector counting least significant bit assertions in a given number of digital signal samples to measure whether a meta-stability error bias exceeds a predetermined threshold.

Each of the foregoing may be implemented individually or in combination, and may be implemented with any one or more of the following features in any suitable combination: 1. the asynchronous bit cycles each include an adjustable delay, and the detector accelerates the asynchronous bit cycles by reducing the adjustable delay. 2. the adjustable delay is an interval between assertion of a Done signal and a beginning of a subsequent asynchronous bit cycle. 3. the asynchronous bit cycles have an adjustable time limit, and the detector accelerates the asynchronous bit cycles by reducing the adjustable time limit. 4. a retriggerable one shot that implements the adjustable time limit. 5. a counter to count a number of asserted least significant bits in a given number of said digital signal samples. 6. a comparator to determine whether the number of asserted least significant bits varies from 50% of the given number by more than the predetermined threshold. 7. the detector further includes a filter that adapts an adjustable component of the asynchronous bit cycles based on the comparator's output. 8. the detector adapts the adjustable delay or adjustable time limit to limit the meta-stability error bias at the predetermined threshold. 9. the detector filters the detector's output to reduce the adjustable delay or adjustable time limit when the meta-stability error bias exceeds the predetermined threshold. 10. the detector uses the filtered output to increase the adjustable delay or adjustable time limit when the meta-stability error bias falls below the predetermined threshold.

DETAILED DESCRIPTION

Figure 1:
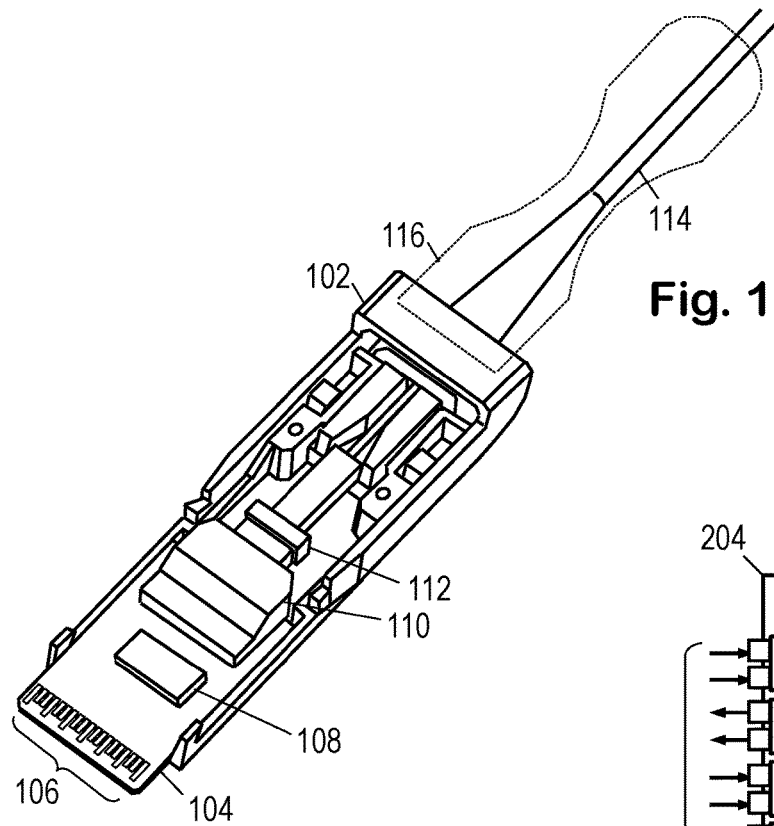
FIG. 1 is a perspective view of an illustrative fiberoptic cable connector.

While specific embodiments are given in the drawings and the following description, keep in mind that they do not limit the disclosure. On the contrary, they provide the foundation for one of ordinary skill to discern the alternative forms, equivalents, and modifications that are encompassed in the scope of the appended claims.

As an illustrative usage context, FIG. 1 shows a fiberoptic cable connector such as might be used to connect computers and network devices in a data processing center. A connector frame 102 houses a printed circuit board (PCB) assembly 104 configured with edge connector contacts 106. Edge connector contacts 106 mate with contacts in a socket of a host device's network interface port to send and receive electrical signals. The PCB assembly 104 includes one or more packaged integrated circuit (IC) chips or discrete electrical components mounted to contact pads on the PCB. For example, the PCB assembly 104 may include a digital data recovery and remodulation (DRR) device 108 that equalizes received signals, recovers the data, and retransmits the recovered data with optional error correction, signal format conversion, and lane realignment.

The PCB assembly 104 includes an optical coupling module 110 that couples integrated photodetectors and photoemitters to one or more optical paths. When mated with the optical coupling module 110, a ferrule 112 aligns one or more optical fibers the fiberoptic cable 114 with the one or more optical paths. The optical coupling module 110 would typically use lenses and prisms to define the optical paths that couple light signals between the optical fibers and the photodetectors and photoemitters, though other optical elements (e.g., mirrors, gratings) would also be suitable.

The fiberoptic cable connector may further include a cover and a finger grip 116 to protect the other components from damage during normal use.

Figure 2:
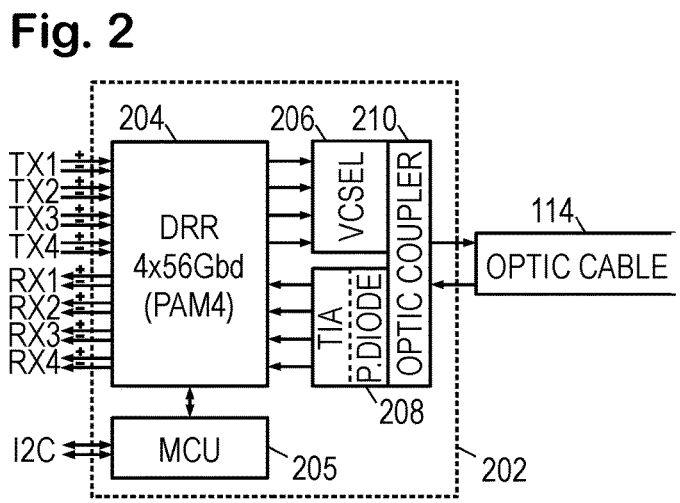
FIG. 2 is a block diagram of an illustrative fiberoptic cable connector.

FIG. 2 is a block diagram to more clearly illustrate the signal flows of an illustrative fiberoptic cable connector 202. A DRR device 204 couples to the network interface port to accept 28 or 56 gigabaud (GBd) electrical transmit signals from the host on each of four lanes and to provide the host with 28 or 56 GBd electrical receive signals on each of four lanes. The electrical transmit and receive signals are differential signals that may employ non-return to zero (NRZ) signaling or 4-level pulse amplitude modulation (PAM4) signaling. After accounting for overhead, four signal lanes collectively transport data at a nominal 100 or 200 gigabits per second (Gbps) for NRZ and 200 or 400 Gbps for PAM4.

The connector 202 may further include a microcontroller unit (MCU) 205 that couples to the network interface port via a management data bus such as the inter-integrated circuit (I2C) bus or the management data input/output (MDIO) bus. The host may use the management data bus to identify the cable's capabilities, determine connection status, diagnose faults, and/or configure operation of the cable connector. The MCU 205 processes commands received via the management data bus to appropriately read or set the control registers of the DRR device 204. In at least some cases, the MCU 205 is integrated into the DRR device 204.

Optical coupling module 110 (FIG. 1) includes photoemitter array 206, optical path coupler 210, and photodetector array 208. DRR device 204 converts the electrical transmit signals into remodulated electrical transmit signals that drive an array of photoemitters 206. As one example, the photoemitters in the array are vertical cavity surface-emitting lasers (VCSEL). The electrical drive signals cause current flow in the photoemitters, which in turn emit light signals having an intensity corresponding to the amplitude of the current flow.

An optical path coupler 210 optically couples the light signals from the photoemitters to optical fibers in cable 114 and couples light signals from optical fibers cable 114 to an array of photodetectors 208. Various suitable photodetector implementations are available in the literature. As one example, the photodetectors in the array are photodiodes having an impedance that corresponds to the intensity of a received light signal. The photodiodes can be voltage-biased to convert the impedance into a corresponding current flow. A transimpedance amplifier (TIA) provides amplification of the current flow while transforming the current flow into a receive signal voltage.

Figure 3:
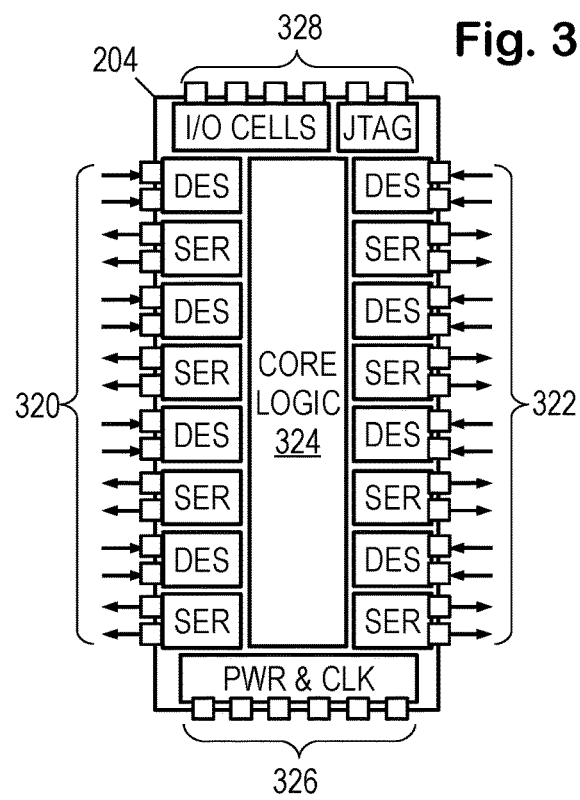
FIG. 3 is a block diagram of an illustrative serializer-deserializer transceiver device.

DRR device 204 is preferably implemented on a monolithic integrated circuit chip. FIG. 3 is a block diagram for such a device, with contacts 320 for host-facing serializer-deserializer (SerDes) modules to receive and transmit high-rate serial bitstreams across four differential signal lanes of a bus interface, additional contacts 322 for channel-facing SerDes modules to convey the high-rate serial bitstreams to and from the transducers coupled to the fiberoptic channel, and core logic 324 for implementing a channel communications protocol while buffering bitstreams between the channel and host interface. Also included are various supporting modules and contacts 326, 328, such as power regulation and distribution, clock generation, digital input/output lines for control signals, and a JTAG module for built-in self testing.

The "deserializer" implements the receiving function of the chip 204, implementing decision feedback equalization ("DFE") or any other suitable digital equalization technique that may employ a discrete-time finite impulse response ("FIR") filter with adjustable tap coefficients, e.g., linear equalization, partial response equalization. At the contemplated symbol rates (above 50 Gbd), the deserializer operates under severe timing constraints demanding fast, reliable ADC.

Figure 4:
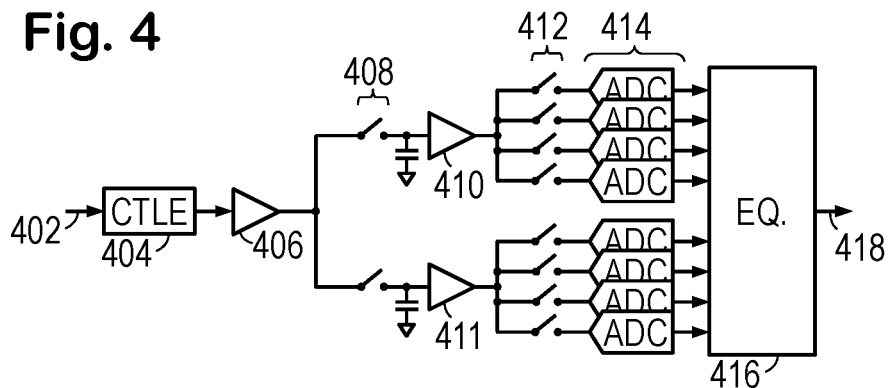
FIG. 4 is a schematic of an illustrative parallelized analog-to-digital converter (ADC).

To ease the digitization timing constraints, the digitization process may be parallelized as illustrated in FIG. 4. An analog input signal 402 may be filtered by a continuous time linear equalizer (CTLE) to mitigate aliasing and to optionally provide some initial spectral shaping or compensation of the channel impulse response (e.g., with high frequency pre-emphasis). A buffer 406 passes the filtered signal to a first set of switches 408 which operate alternately to forward the buffered signal in a time interleaved fashion to buffer 410 and buffer 411. The input capacitance of the buffers 410, 411, hold the analog signal voltage steady after the respective switch 408 opens.

A second set of switches 412 also operate in a time interleaved fashion to each provide a corresponding ADC in set 414 with every eighth sample. Each ADC has an internal capacitance that holds the sample voltage during the conversion process. The time interleaving enables each ADC to perform the digitization process over multiple symbol periods. A digital equalizer 416 may operate on the (parallelized) sequence of digital sample values to derive a digital data stream 418.

Figure 5:
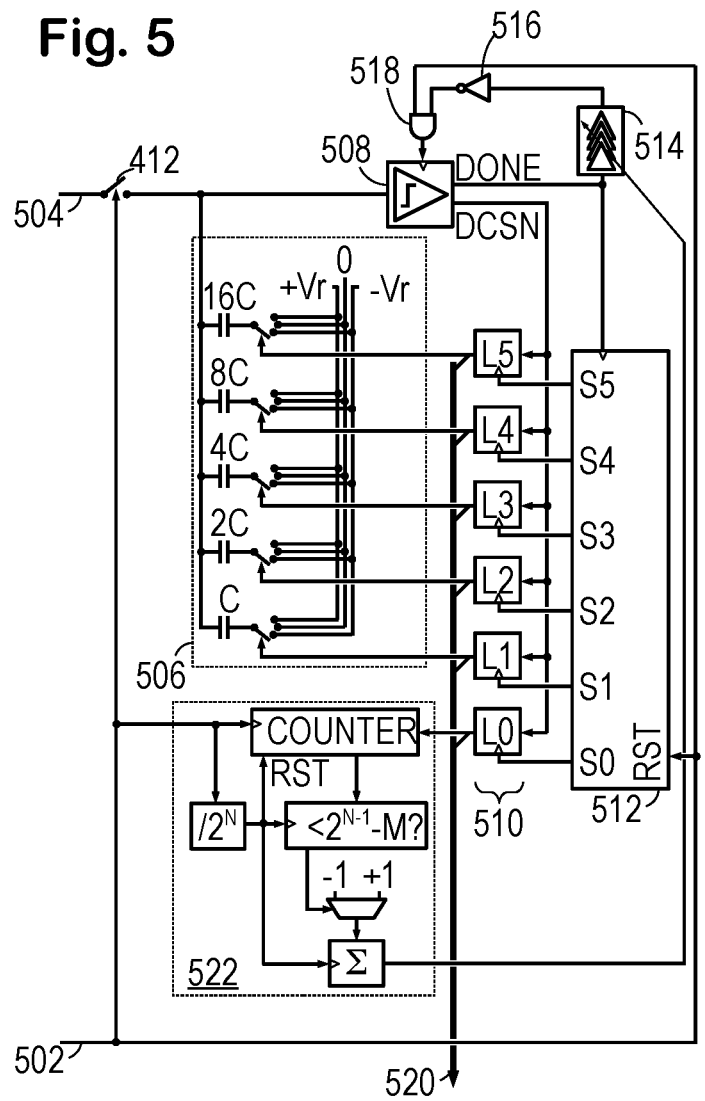
FIG. 5 is a schematic of an illustrative successive approximation register ADC.

Each of the ADCs 414 in FIG. 4 could be implemented as an asynchronous SAR ADC such as that shown in FIG. 5. An active-low sample clock signal 502 resets latches 510 and state machine circuit 512, grounding the switched terminal for each of the capacitors in capacitor bank 506. Sample clock 502 momentarily causes switch 412 to close, enabling analog input signal 504 to charge the capacitors in capacitor bank 506. Switch 412 then opens so that the sample voltage is held by the capacitor bank at the beginning of the digitization process.

Comparator 508 compares the capacitor bank voltage to a reference voltage Vr, which is half the span between the analog voltages corresponding to the minimum and maximum binary representations that may be output by the converter. (Depending on the design, an offset may be applied to the reference voltage at the comparator input for calibration and/or DC cancelation.) Comparator 508 asserts an output decision signal (DCSN) if the analog voltage exceeds the reference voltage and de-asserts DCSN if the analog voltage is less than the reference voltage. Because the speed of the comparison process varies, comparator 508 further asserts a Done signal when the comparison is complete.

The first comparison determines the most significant bit (MSB) of the binary representation, which is latched by latch L5. State machine circuit 512 triggers the latches L5-L0 in turn for sequential assertions of the Done signal, such that successive comparison operations set the binary representation bits in order from MSB to least significant bit (LSB). When a latch is triggered (e.g., latch L5), it causes the switched terminal of the respective capacitor in capacitor bank 506 to connect to −Vr (if the latched bit is one) or to connect to +Vr (if the latched bit is zero). The capacitors in capacitor bank 506 are exponential, in that the capacitance controlled by latch Ln is $2^{n-1}$ C, where C is the input capacitance of comparator 508. The latches cause the capacitor bank voltage to shift downward (if latched bit is zero) or upward (if latched bit is one) by $Vr/2^{(N-n)}$, where N is the number of bits (latches).

Thus, the triggering of latch L5 causes the capacitor bank voltage to shift downward (if capacitor voltage exceeds the reference voltage) or upward (if the capacitor voltage is less than the reference voltage) by Vr/2. The triggering of latch L4 causes the capacitor bank voltage to shift by Vr/4. The triggering of latch L3 causes the capacitor bank voltage to shift by Vr/8. In this fashion, the SAR ADC performs a binary search for the best digital representation of the sample voltage.

The subsequent comparisons are self-triggered via a feedback loop. A delay element 514 delays the Done signal by an adjustable delay. An inverter 516 inverts the Done signal to provide a bit cycle clock that, if permitted by the logical AND gate 518, it triggers comparator 508 to begin the next comparison asynchronously. (If clock 502 is low, the logical AND gate interrupts the bit cycle clock as part of the ADC reset operation.) Delay element 514 provides time for the capacitor bank voltage to settle after the completion of the previous bit cycle. This settling time can be shortened or lengthened as described further below.

In normal operation, the SAR ADC completes each of the bit cycles to determine the full binary representation of the analog sample voltage, which is output on bus 520. It is expected that each of these binary representations will have a 50%-50% probability of a zero or one LSB, and that over a reasonably-sized window the number of zeros (or alternatively, the number of ones) will average 50% of the window size with a tight, symmetric binomial distribution.

However, if comparator 508 demonstrates meta-stable behavior during one of the bit cycles, the SAR ADC is unable to complete the subsequent bit cycles for that sample, leaving at least some of the remaining latches untriggered. The untriggered latches are thus left holding their reset values, e.g., zero. Repeated occurrences of meta-stable behavior will thus bias the LSB probability distribution, causing the number of LSB zeros within a given window to deviate significantly from 50% of the window size.

To exploit this observation, the SAR ADC of FIG. 5 includes a detector 522 that operates on the LSB from latch L0. The detector includes a counter triggered by sample clock 502 to count up if the LSB is one or to remain constant if the LSB is a zero. A divider ($/2^N$) divides the sample clock 502 by $2^N$, producing a window clock signal that is asserted once every $2^N$ sample clocks. At the end of each window, the window clock triggers a comparison of the counted number of ones to a threshold, shown in FIG. 5 as $2^{N-1}$-M. The $2^{N-1}$ represents 50% of the window size, and M is a margin that may serve to distinguish a statistical bias from routine variation. If the counted number of ones is less than 50% of the window size by more than the margin, the comparator decides that meta-stable behavior is likely present, causing a −1 to be supplied to an integrator or other form of feedback filter. Otherwise, the comparator supplies a +1 to the integrator or filter. The integrator output serves as a control signal to adjust the lag duration provided by delay element 514.

If the detector 522 repeatedly detects meta-stable behavior, the control signal decreases the lag, accelerating the bit cycles by reducing the settling time for capacitor bank voltage. Because the bit cycles begin sooner, there is provided additional time for comparator 508 to complete each of the bit cycles before the next sample clock. The occurrences of meta-stable behavior are expected to decrease, causing the control signal to stabilize or increase the lag of delay element 514, optimizing the tradeoff between settling time and occurrences of meta-stable behavior.

The window size $2^N$ is a design parameter chosen with various factors in mind including detection accuracy, detection latency, hardware complexity. In at least one embodiment, N is chosen to be 16. If margin M is set at about 170, the probability of routine statistical variation in a given window being mistaken for a meta-stability bias would be less than 10%. With the integrator, however, it may be feasible to use a smaller margin M, e.g., M=0.

Figure 6:
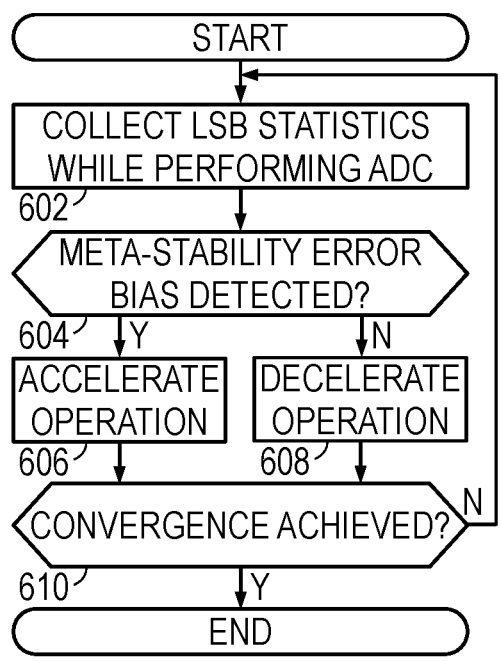
FIG. 6 is a flow diagram of an illustrative ADC adaptation method.

FIG. 6 is a flow diagram of a method for adapting operation of an asynchronous SAR ADC. In block 602, a detector collects statistics of digitized sample LSBs while the ADC operates. More specifically, the detector counts LSB ones or zeros to estimate LSB probabilities. In block 604, the detector determines whether the LSB probabilities are 50%/50%, or whether there is a statistical bias attributable to meta-stability errors. If a meta-stability error bias is detected, the detector accelerates the asynchronous bit cycles in block 606 to reduce the rate of meta-stability errors. If no meta-stability error bias is detected, the detector decelerates the asynchronous bit cycles in block 608 to improve digitization performance, at the potential risk of increasing the rate of meta-stability errors.

In block 606, the detector may detect whether convergence has been achieved. For example, the detector may track the adjustment history to determine whether the adjustments are trending upward or downward. If the adjustment history within a given window is neutral (not upward or downward), the detector may determine that convergence has been achieved and end the adaptation process. Otherwise, the detector may return to block 602.

Figure 7:
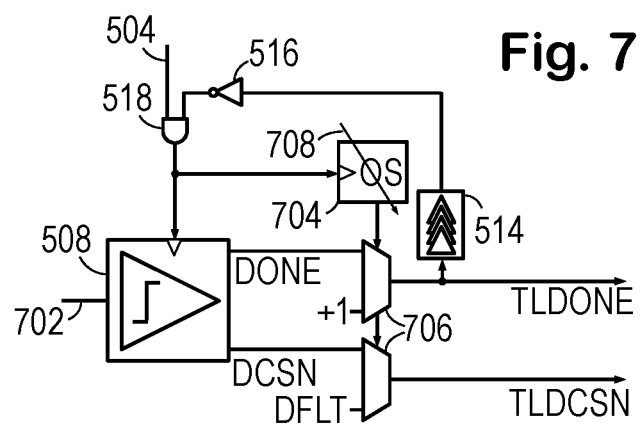
FIG. 7 is a schematic of an illustrative time-limited comparator.

FIG. 7 shows an illustrative time-limited comparator, which may be used as an alternative way to accelerate bit cycles in an SAR ADC. Comparator 508 receives the voltage signal 702 from capacitor bank 506 (FIG. 5), and when permitted by sample clock 504 and logical AND gate 518, receives the bit cycle clock from inverter 516. When reset by the clock signal(s), comparator 508 de-asserts the Done signal and begins comparing the voltage signal 702 to a reference voltage. When the comparison is complete, the decision signal is accordingly driven high or low, and the Done signal is asserted. As long as the comparator 508 completes the comparison within a time-limited period, multiplexers 706 pass the Done and decision signals on as time-limited done (TLDONE) and time-limited decision (TLDCSN) signals. The TLDONE signal is supplied in place of the Done signal to state machine circuit 512 (FIG. 5) and delay element 514. The TLDCSN signal is supplied in place of the DCSN signal to latches 510 (FIG. 5).

Multiplexers 706 are controlled by a retriggerable one-shot circuit 704. If a given time delay elapses after the comparator 508 is reset, one-shot 704 switches the multiplexers 706 to drive the TLDONE signal high and to drive the TLDCSN signal to a default value. The default value may be fixed, (e.g., zero), but is preferably random or systematically toggled between zero and one so as to simulate the effect of random noise. After the TLDONE signal propagates through the delay element 514 and resets the comparator, the one-shot 704 restores the multiplexers to forward the DONE and DCSN signals. It is expected that most of the time the comparator completes the comparison and the delay element 514 delivers the asserted TLDONE signal in less than the given time delay, re-triggering the one-shot to maintain the multiplexers 706 in this state.

The time delay of one-shot 704 adjusts in response to a control signal 708 from detector 522 (FIG. 5). When detector 522 detects a meta-stability error bias, the asynchronous bit cycles can be accelerated by reducing the time delay of one-shot circuit 704. If no meta-stability error bias is detected, the time delay of one-shot 704 can be increased to give the comparator more time to complete its operation at the risk of increasing the meta-stability error rate. The detector optimizes the tradeoff between these situations.

Numerous alternative forms, equivalents, and modifications will become apparent to those skilled in the art once the above disclosure is fully appreciated. It is intended that the claims be interpreted to embrace all such alternative forms, equivalents, and modifications that are encompassed in the scope of the appended claims.

What is claimed is:

1. An integrated circuit chip that comprises:
    a successive approximation register analog to digital converter (SAR ADC) that employs asynchronous bit cycles to convert a sequence of analog signal samples into a sequence of digital signal samples; and
    a detector that accelerates the asynchronous bit cycles when a meta-stability error bias exceeds a predetermined threshold.

2. The chip of claim 1, wherein the asynchronous bit cycles each include an adjustable delay, and wherein the detector accelerates the asynchronous bit cycles by reducing the adjustable delay.

3. The chip of claim 2, wherein the adjustable delay is an interval between assertion of a Done signal and a beginning of a subsequent asynchronous bit cycle.

4. The chip of claim 1, wherein the asynchronous bit cycles have an adjustable time limit, and wherein the detector accelerates the asynchronous bit cycles by reducing the adjustable time limit.

5. The chip of claim 1, further comprising a retriggerable one shot that implements the adjustable time limit.

6. The chip of claim 1, wherein the detector includes a counter to count a number of asserted least significant bits in a given number of said digital signal samples.

7. The chip of claim 6, wherein the detector further includes a comparator to determine whether the number of asserted least significant bits varies from 50% of the given number by more than the predetermined threshold.

8. The chip of claim 7, wherein the detector further includes a filter that adapts an adjustable component of the asynchronous bit cycles based on the comparator's output.

9. A method that comprises:
    converting a sequence of analog signal samples to a sequence of digital signal samples using a successive approximation register analog to digital converter (SAR ADC) with asynchronous bit cycles;
    deriving a meta-stability error bias from the sequence of digital signal samples; and
    accelerating the asynchronous bit cycles when the meta-stability error bias exceeds a predetermined threshold.

10. The method of claim 9, wherein the asynchronous bit cycles each include an adjustable delay, and wherein said accelerating includes reducing the adjustable delay.

11. The method of claim 10, further comprising decelerating the asynchronous bit cycles when the meta-stability error bias falls below the predetermined threshold, wherein said decelerating includes increasing the adjustable delay.

12. The method of claim 9, wherein the asynchronous bit cycles have an adjustable time limit, and wherein the detector accelerates the asynchronous bit cycles by reducing the adjustable time limit.

13. The method of claim 12, further comprising decelerating the asynchronous bit cycles when the meta-stability error bias falls below the predetermined threshold, wherein said decelerating includes increasing the adjustable time limit.

14. The method of claim 9, wherein said deriving includes counting a number of asserted least significant bits in a given number of said digital signal samples.

15. The method of claim 14, wherein said deriving further includes comparing 50% of the given number minus the number of asserted least significant bits to the predetermined threshold.

16. The method of claim 15, wherein said deriving further includes filtering a result of said comparing and adapting an adjustable component of the asynchronous bit cycles based on the filtered result.

17. A parallelized analog to digital converter that comprises:
    a switch tree that distributes time-interleaved samples of an analog input signal to an array of successive approximation register analog to digital converters (SAR ADCs), each of the SAR ADCs converting their analog signal samples to digital signal samples using asynchronous bit cycles, the asynchronous bit cycles including an adjustable delay or having an adjustable time limit; and
    a detector counting least significant bit assertions in a given number of digital signal samples to measure whether a meta-stability error bias exceeds a predetermined threshold.

18. The parallelized analog to digital converter of claim 17, wherein the detector adapts the adjustable delay or adjustable time limit to limit the meta-stability error bias at the predetermined threshold.

19. The parallelized analog to digital converter of claim 18, wherein the detector filters the detector's output to reduce the adjustable delay or adjustable time limit when the meta-stability error bias exceeds the predetermined threshold.

20. The parallelized analog to digital converter of claim 19, wherein the detector uses the filtered output to increase the adjustable delay or adjustable time limit when the meta-stability error bias falls below the predetermined threshold.

* * * * *